(12) United States Patent
Rao

(10) Patent No.: US 7,787,311 B2
(45) Date of Patent: Aug. 31, 2010

(54) MEMORY WITH PROGRAMMABLE ADDRESS STRIDES FOR ACCESSING AND PRECHARGING DURING THE SAME ACCESS CYCLE

(76) Inventor: G. R. Mohan Rao, 1404 Westmont Dr., McKinney, TX (US) 75070

( * ) Notice: Subject to any disclaimer, the term of this patent is extended or adjusted under 35 U.S.C. 154(b) by 371 days.

(21) Appl. No.: 11/937,407

(22) Filed: Nov. 8, 2007

(65) Prior Publication Data

US 2009/0122627 A1 May 14, 2009

(51) Int. Cl.
*G11C 8/18* (2006.01)
(52) U.S. Cl. ............. 365/189.04; 365/203; 365/233.19; 365/230.03; 711/5; 711/221
(58) Field of Classification Search ................. 365/203, 365/230.03, 233.13, 233.19, 189.04; 711/5, 711/168, 221
See application file for complete search history.

(56) References Cited

U.S. PATENT DOCUMENTS

| 6,507,900 | B1 | 1/2003 | Okajima |
| 6,748,480 | B2 | 6/2004 | Chudnovsky et al. |
| 7,254,690 | B2 * | 8/2007 | Rao ........................... 711/169 |
| 2009/0097346 | A1 * | 4/2009 | Rao ........................... 365/203 |
| 2009/0122627 | A1 * | 5/2009 | Rao ........................... 365/203 |

FOREIGN PATENT DOCUMENTS

JP 2002-175215 A 6/2002

OTHER PUBLICATIONS

Eero Aho et al., "Parallel Memory Implementation for Arbitrary Stride Accesses," International Conference on Embedded Computer Systems: Architectures, Modeling, and Simulation, Jul. 17-20, 2006, pp. 1-6.
International Search Report and Written Opinion mailed Mar. 4, 2009 for PCT/US2008/082104.
International Preliminary Report on Patentability, issued in International Patent Application No. PCT/US2008/082104, mailed May 20, 2010, 8 pages.

* cited by examiner

*Primary Examiner*—Andrew Q Tran
(74) *Attorney, Agent, or Firm*—Schwabe, Williamson & Wyatt, P.C.

(57) ABSTRACT

Embodiments of the present disclosure provide methods, apparatuses and systems including a storage configured to store and output multiple address strides of varying sizes to enable access and precharge circuitry to access and precharge a first and a second group of memory cells based at least in part on the multiple address strides during operation of the host apparatus/system, the first and second group of memory cells being different groups of memory cells.

25 Claims, 4 Drawing Sheets

MEMORY WITH PROGRAMMABLE ADDRESS STRIDES FOR ACCESSING AND PRECHARGING DURING THE SAME ACCESS CYCLE

TECHNICAL FIELD

Embodiments of the present disclosure relate to the field of integrated circuits, and, more specifically, to digital memory apparatuses, systems, and methods for accessing and precharging memory cells with various address strides.

BACKGROUND

Semiconductor memories—such as, for example, DRAM'S, SRAM'S, ROM'S, EPROM'S, EEPROM'S, Flash EEPROM'S, Ferroelectric RAM'S, MAGRAM'S and others—have played a vital role in many electronic systems. Their functions for data storage, code (instruction) storage, and data retrieval/access (Read/Write) continue to span a wide variety of applications. Usage of these memories in both stand alone/discrete memory product forms, as well as embedded forms such as, for example, memory integrated with other functions like logic, in a module or monolithic integrated circuit, continues to grow. Cost, operating power, bandwidth, latency, ease of use, the ability to support broad applications (balanced vs. imbalanced accesses), and non-volatility are all desirable attributes in a wide range of applications.

In typical memory systems, memory is utilized and accessed by applications according to an address stride. An address stride may be defined as the memory address spacing between successive memory accesses and/or writes by hardware, firmware, or software operating on the memory system. The size of an address stride may vary depending upon many factors including, but not limited to, the complexity of an application, and/or the architecture of the system.

In systems with a single processor, there may be a need for only a single address stride due to the processor typically finishing with one application before beginning the next. In this manner an address stride may be used for each application without the need to vary the size of the address stride. But in multiple processor systems, two or more processors may, for example, attempt to access memory in parallel while running different applications. The ability to access and precharge the memory at different address strides for each of the processors, however, has been previously unavailable. This may lead to a decline in the desirable attributes mentioned previously.

BRIEF DESCRIPTION OF THE DRAWINGS

Embodiments of the present disclosure will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS OF THE INVENTION

Figure 1:
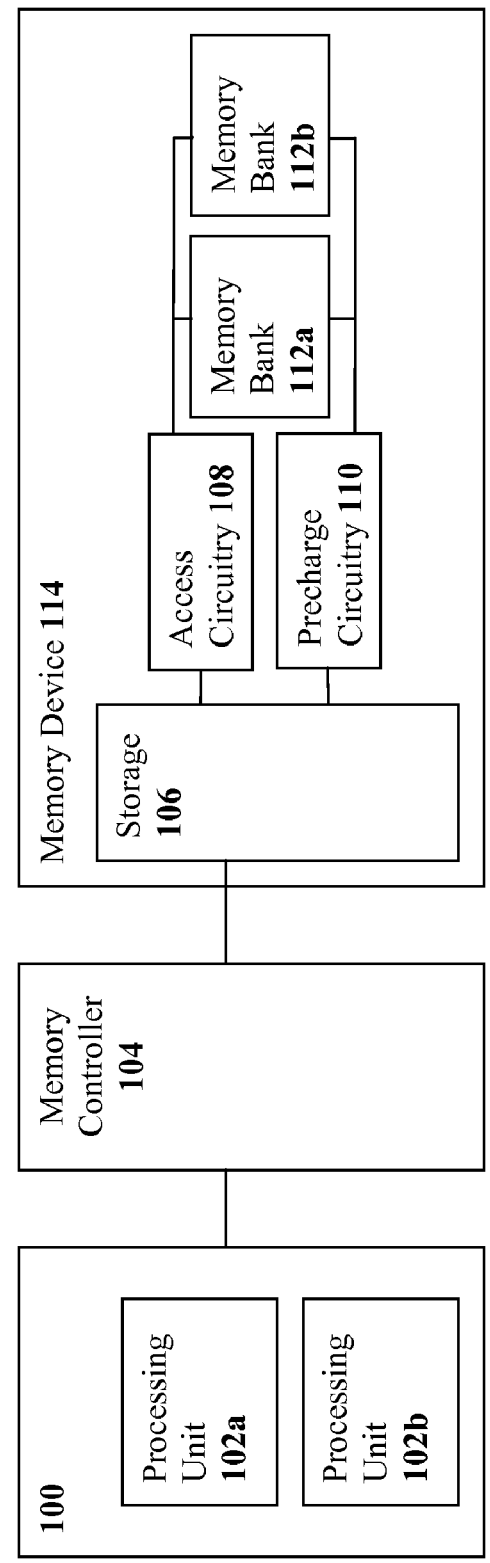
FIG. 1 illustrates a functional system block diagram including a digital memory device in accordance with various embodiments of the present disclosure.

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure are defined by the appended claims and their equivalents.

Various operations may be described as multiple discrete operations in turn, in a manner that may be helpful in understanding embodiments of the present disclosure; however, the order of description should not be construed to imply that these operations are order dependent. Additionally, various embodiments of operations need not include all of the discrete operations as described.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "access cycle" may be used throughout the specification and claims and may refer to the time during which an access operation is performed on a memory system which may include at least one memory device. Such an access operation may be a READ, WRITE or other access operation to one or more devices. An access cycle as such does not necessarily refer to a single "clock cycle" of the device or system, but may in fact occur over the course of multiple clock cycles.

Embodiments of the present disclosure may include digital memory devices, such as but not limited to dynamic random access memory (DRAM) devices that are configured to receive, store, and output address strides of different sizes. In this manner, a processing unit may, during an access cycle, independently access and/or precharge a plurality of memory cells based on a first address stride, while another processing unit precharges and/or accesses a plurality of memory cells based on a second address stride. In further embodiments, the digital memory device may be partitioned, logically or physically, into one or more subsets of a plurality of memory cells. A first processor may then access or precharge a first subset of the plurality of memory cells with a first address stride, while a second processor may access or precharge a second subset of the plurality of memory cells with a second address stride of a different size. As more processors are incorporated, more subsets may be partitioned. Consequently, a plurality of processors may access and precharge the memory in parallel according to varying address stride lengths. In another embodiment, the address requests by each processor, e.g. a core or a unit, may be pipelined without a latency penalty as described by U.S. Pat. No. 7,254,690 "Pipelined Semiconductor Memories and Systems" issued Aug. 7, 2007.

In various embodiments, the address strides may be determined using a programmable look-up table. This may allow the address strides to be programmed to provide optimized stride lengths that may be modified dynamically. In other embodiments the address stride lengths may be modified based upon past accesses by one or more processors.

Referring to FIG. 1, a functional system block diagram including a digital memory device in accordance with various embodiments of the present disclosure is illustrated. The system may include a plurality of processors 102a and 102b. The processors may be stand alone processors or core processors disposed on a single integrated circuit 100. The system may also include a memory controller 104, coupled to a digital memory device 114. Digital memory device 114 is illustrated as a stand-alone integrated circuit, however, other types are certainly contemplated, such as for example, embedded memory or cache memory. Digital memory device 114 may further comprise a storage 106, access circuitry 108, precharge circuitry 110, and memory banks 112a and 112b.

In various embodiments, storage 106 may be configured to store and output address strides of different sizes during operation of a host apparatus. The storage 106 may be a storage element that is incorporated into digital memory device 114 for the purpose of storing and outputting address strides, or in other embodiments may be implemented into currently existing storage elements such as a mode register. For example, a mode register may contain bits that are currently unused or reserved. In various embodiments, these reserved bits may be used to store address strides or a program counter which is programmable to control the size of various address strides. In such a manner, the storage 106 may be configured to store and output, for example, a first address stride and a second address stride of different sizes, and further, may be modifiable with respect to the first and second address strides. In other embodiments, the storage may also or alternatively comprise a programmable look up table to dynamically generate address strides. This may allow a processing unit to process an application with one address stride for an amount of time, and later, process the application with another address stride of a different size. In various other embodiments, the storage 106 may be coupled to a memory controller that may dynamically configure the storage 106 with respect to the first and second address strides the storage is to output. This will be discussed further with reference to the memory controller 104.

In various embodiments, the storage 106 may be coupled to access circuitry 108 and precharge circuitry 110. Alternatively, the access circuitry 108 and precharge circuitry 110 may be coupled to memory controller 104. Access and precharge circuitry may be logically or physically separate and include independent circuit connections to memory banks 112a and 112b as taught by U.S. patent application Ser. No. 11/873,283 "Memory with Independent Access and Precharge." The independent circuit connections of access circuitry 108 and precharge circuitry 110 may allow access to memory banks 112a or 112b while allowing the simultaneous precharging of memory banks 112a or 112b. For example, access circuitry 108 may access a plurality of memory cells disposed on memory bank 112a based on at least a first address stride, and precharge circuitry 110 may precharge a plurality of memory cells disposed on memory bank 112b based at least in part on a second address stride during an access cycle. The first and second address strides, as stated previously may be output by the storage, or in other embodiments, modified or output by a memory controller.

Digital memory device 114 may include a first group of a plurality of memory cells disposed on a first bank 112a, and a second group of a plurality of memory cells disposed on a second bank 112b. The memory cells may be memory cells of any type. For example, the memory cells may be dynamic random access memory (DRAM) cells, or static random access memory (SRAM) cells. The invention is not to be limited in this regard. In various embodiments, the plurality of memory cells may be arranged into arrays, and partitioned into subarrays. While not illustrated, memory banks 112a and 112b may further include sense amplifier circuits to sense voltages stored in the memory cell arrays during READ operations and drive voltages into the memory cell arrays during WRITE operations. Memory banks 112a and 112b may also include a plurality of decoders to decode addresses received by memory banks 112a and 112b. While two memory banks are depicted, it should be understood that any number of memory banks, memory cells, or memory modules may be utilized for the purposes of this invention.

Digital memory device 114 may, in various embodiments, be a dual in-line memory module (DIMM). In such embodiments, digital memory device 114 may operate in conjunction with multiple DIMMs. The multiple DIMMS may each include similar storage elements 106 to precharge and access each DIMM according to varying address strides, or in other embodiments, may be coupled to a memory controller 104 configured to send independent precharge and access commands, including varying address strides, to each DIMM.

In various embodiments, the memory controller 104 may be coupled to digital memory device 114 and its included elements, or may be incorporated into digital memory device 114. The memory controller 104 may configure the storage with respect to the first and second address strides for accessing the memory cells. In various embodiments, this configuring may be based on the needs of one or multiple distinct processing units. In such instances, the controller may dynamically modify the storage with the address strides for the one or multiple processing units.

In other embodiments, the memory controller may itself be configured to determine and output varying address strides. In one embodiment, the memory controller may determine address strides based upon past memory accesses by a processing unit. The past memory accesses may be memory accesses by one or a plurality of processing units or processing cores. In other embodiments, the memory controller may be configured to compute a programmable look up table to determine the address strides. A programmable look up table may allow address strides to be programmed to any optimal size.

Digital memory device 114 may be accessed by one or more processors. In the illustrated embodiment, two processors are coupled to digital memory device, processors 102a and 102b. More or fewer processors may be coupled to digital memory device 114. In various embodiments, the processors may be processing units or processing cores. Additionally, the processing units may be disposed remotely from each other, or they may be implemented as processing cores commonly disposed on a single integrated circuit 100. Processors 102a and 102b may be coupled to digital memory device 114 via various elements and may access and precharge various memory banks in parallel.

In various embodiments, a memory controller may partition a plurality of memory cells into first and second partitions of memory cells. The first and second partitions of memory cells may be allocated to a first and second processing unit, respectively. A memory controller or storage, coupled to the partitions of memory cells and the plurality of processors may determine optimized address strides for the first and second processors to access and precharge the partitioned memory cells. In this manner, the partitions of memory cells may be successively accessed with addresses in accordance with a first and a second address stride which may be address strides of different sizes. For example, a first processing unit may access a first partition of memory cells according to a first address stride, and a second processing unit may precharge a second partition of memory cells according to a second address stride during an access cycle. In various embodiments, the plurality of memory cells may be logically partitioned or physically partitioned, and may be disposed on a first memory bank and a second memory bank, the first and second memory banks being different memory banks.

Figure 2:
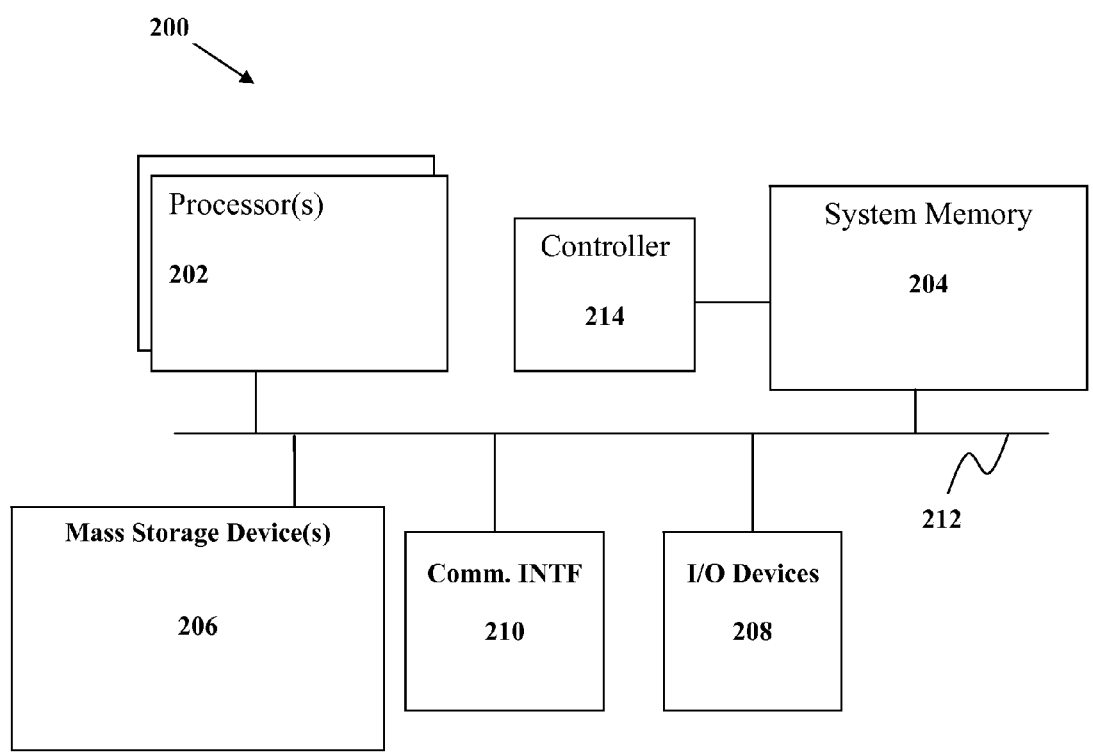
FIG. 2 illustrates an example computing system suitable for use to practice the invention, in accordance with various embodiments.

FIG. 2 illustrates an example computing system/device suitable for use to practice various digital memory devices incorporating embodiments of the present disclosure. As shown, computing system/device 200 may include one or more processors 202, and system memory 204, such as for example digital memory device 114 of FIG. 1. Additionally, computing system/device 200 may include mass storage devices 206 (such as diskette, hard drive, CDROM and so forth), input/output devices 208 (such as keyboard, cursor control and so forth) and communication interfaces 210 (such as network interface cards, modems and so forth). The elements may be coupled to each other via system bus 212, which represents one or more buses. In the case of multiple buses, they may be bridged by one or more bus bridges (not shown). Finally, controller 214 embodied with some or all of the teachings of the present disclosure may be provided and configured to operate memory 204. In embodiments, controller 214 may be configured to issue READ and WRITE access commands to memory 204 and also to issue precharge commands to memory 204 with varying address strides in accordance with various embodiments of the present disclosure. In embodiments, controller 214 may be configured to issue a next precharge address to memory 204 according to an address stride which is computed using past accesses or a history of accesses, or in other embodiments through the use of a programmable look up table. In alternative embodiments, memory 204 may include a controller (not shown) to perform some or all of the functions of controller 214. In embodiments, some or all of the functions of controller 214 could be effectively implemented within memory 204. In embodiments, such functions may be performed by use of a mode register within memory 204.

Other than the teachings of the various embodiments of the present disclosure, each of the elements of computer system/device 200 may perform its conventional functions known in the art. In particular, system memory 204 and mass storage 206 may be employed to store a working copy and a permanent copy of programming instructions implementing one or more software applications.

Although FIG. 2 depicts a computer system, one of ordinary skill in the art will recognize that embodiments of the present disclosure may be practiced using other devices that utilize DRAM or other types of digital memory such as, but not limited to, mobile telephones, Personal Data Assistants (PDAs), gaming devices, high-definition television (HDTV) devices, appliances, networking devices, digital music players, digital media players, laptop computers, portable electronic devices, telephones, as well as other devices known in the art.

Figure 3:
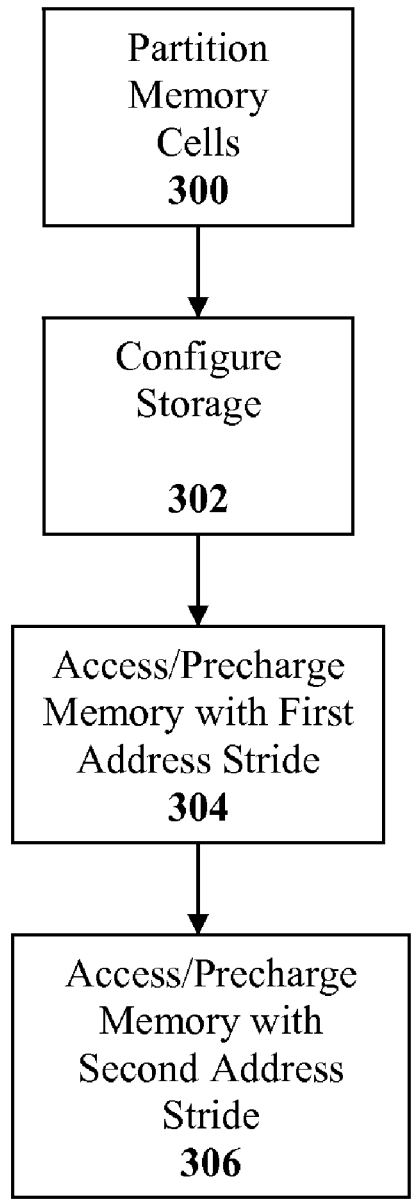
FIG. 3 illustrates a flow chart of a method for accessing and/or precharging a plurality of memory banks or cells with a plurality of address strides in accordance with various embodiments of the present disclosure.

Referring now to FIG. 3, a flow chart of a method for accessing and/or precharging a plurality of memory banks or cells with a plurality of address strides in accordance with various embodiments of the present disclosure is illustrated. At block 300 a plurality of memory cells may be partitioned. The memory cells may be virtually or logically partitioned by a memory controller, or may be physically partitioned. The partitioned memory cells may be allocated to one or more processing units or processing cores.

At block 302, a storage may be configured to store and output one or more address strides. In various embodiments the storage may include a program counter which may be programmable to control the size of the various address strides. In other embodiments, the storage may be dynamically configured by a memory controller with respect to the various address strides. The address strides may be determined based upon past accesses by one or a plurality of processor units, or may be determined based upon a programmable look up table. Such embodiments may allow for the dynamic generation of address strides of any size.

At block 304, a first processor may access or precharge a first partition of a plurality of memory cells according to a first address stride from the storage during an access cycle. At block 306, a second processor may access or precharge a second partition of memory cells according to a second address stride from the storage during the same access cycle. In this manner, for example, the first processor may access or precharge the first partition of memory cells according to a first address stride while a second processor accesses or precharges the second partition of memory cells according to a second address stride that is a different size than the first address stride.

Figure 4:
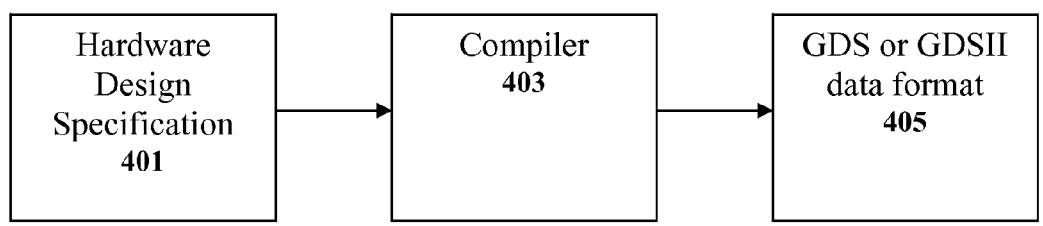
FIG. 4 illustrates a block diagram of a hardware design specification being compiled into GDS or GDSII data format in accordance with various embodiments.

In various embodiments, the earlier described memory cells are embodied in an integrated circuit. The integrated circuit may be described using any one of a number of hardware design language, such as but not limited to VHDL or Verilog. The complied design may be stored in any one of a number of data format such as, but not limited to, GDS or GDS II. The source and/or compiled design may be stored on any one of a number of medium such as but not limited to DVD. FIG. 4 shows a block diagram depicting the compilation of a hardware design specification 401 which may be run through a compiler 403 to produce GDS or GDS II data format 405 describing an integrated circuit in accordance with various embodiments.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Those with skill in the art will readily appreciate that embodiments in accordance with the present disclosure may be implemented in a very wide variety of ways. This application is intended to cover any adaptations or variations of the embodiments discussed herein. Therefore, it is manifestly intended that embodiments in accordance with the present disclosure be limited only by the claims and the equivalents thereof.

What is claimed is:

1. An apparatus comprising:
   a storage configured to store and output a first address stride and a second address stride during operation of the apparatus, the first and second address strides being of different stride sizes;
   access circuitry, coupled to the storage, configured to access, during an access cycle and during operation of the apparatus, a first group of a plurality of memory cells based at least in part on the first address stride; and
   precharge circuitry, coupled to the storage and disposed in parallel to the access circuitry, configured to precharge, during the access cycle and during operation of the apparatus, a second group of the plurality of memory cells based at least in part on the second address stride, the first and second groups of memory cells being different memory cells.

2. The apparatus of claim 1, wherein the storage is further configured to be modifiable with respect to the first and second address strides to be output by the storage.

3. The apparatus of claim 2, further comprising a controller coupled to the storage to dynamically configure the storage, during operation of the apparatus, with respect to the first and second address strides the storage is to output, based at least in part on past memory accesses.

4. The apparatus of claim 2, further comprising a controller coupled to the storage to configure the storage with respect to the first and second address strides the storage is to output, the first and second address strides to be used by first and second processing units, respectively, to access the plurality of memory cells during operation of the apparatus, the first and second processing units being different processing units.

5. The apparatus of claim 4, wherein the first and second processing units are first and second processing cores commonly disposed on a single integrated circuit.

6. The apparatus of claim 1, wherein the first and second groups of the plurality of memory cells are disposed on a first and a second memory bank, respectively, of a plurality of memory banks, the first and second memory banks being different memory banks.

7. The apparatus of claim 6, wherein the memory banks form a dual in-line memory module.

8. The apparatus of claim 1, wherein the storage comprises a programmable look up table.

9. The apparatus of claim 1, wherein the memory cells are dynamic random access memory cells.

10. An article of manufacture comprising a plurality of computer readable hardware design language or compilation of the hardware design language, the hardware design language specifying an implementation of the apparatus as set forth in claim 1 as an integrated circuit.

11. The article of manufacture of claim 10 wherein the hardware design language is either VHDL or Verilog.

12. A method comprising:
    configuring a storage to output a first address stride and a second address stride; and
    independently accessing and precharging a first and a second subset of a plurality of memory cells based at least in part on the first and second address strides, respectively, during an access cycle.

13. The method of claim 12, wherein the configuring the storage to output the first address stride and the second address stride comprises a controller dynamically configuring the first and second address strides the storage is to output based at least in part on past memory accesses.

14. The method of claim 12, wherein the configuring the storage to output the first address stride and the second address stride comprises a controller dynamically configuring the first and second address strides the storage is to output based at least in part on a programmable look up table.

15. The method of claim 12, wherein said configuring comprises a controller dynamically modifying the storage with at least one of the first and second address strides.

16. The method of claim 15, wherein the controller dynamically modifying the storage comprises dynamically modifying the storage for one of a plurality of processing units.

17. The method of claim 15, wherein the controller dynamically modifying the storage comprises dynamically modifying the storage for one of a plurality of processor cores commonly disposed on a single integrated circuit.

18. The method of claim 15 further comprising the controller partitioning the memory cells into first and second partitions of memory cells to be successively accessed with addresses in accordance with said first and second address strides.

19. The method of claim 18, wherein the first and second partitions of memory cells are disposed on a first memory bank and a second memory bank, the first and second memory banks being different memory banks.

20. A system comprising:
    a memory controller configured to output, during operation of the system, a first address stride and a second address stride, the first and second address strides being of different sizes; and
    a digital memory unit coupled to the memory controller including:
        access circuitry configured to access, during operation of the system, a first group of a plurality of memory cells based at least in part on the first address stride during an access cycle; and
        precharge circuitry disposed in parallel to the access circuitry and configured to precharge, during operation of the system, a second group of the plurality of memory cells based at least in part on the second address stride during the access cycle, the first and second groups of memory cells being different memory cells.

21. The system of claim 20, wherein the memory controller is configured to determine, during operation of the system, the first address stride and the second address stride based at least in part on past memory accesses.

22. The system of claim 20, wherein the memory controller is further configured to output, during operation of the system, the first and second address strides for accessing the memory cells by a first and a second processing unit, the first and second processing units being different processing units.

23. The system of claim 22, wherein the first and second processing units are first and second processing cores commonly disposed on a single integrated circuit.

24. The system of claim 20, wherein the first and second groups of the plurality of memory cells are disposed on a first and a second memory bank, respectively, of a plurality of memory banks, the first and second memory banks being different memory banks.

25. The system of claim 20, wherein the memory controller comprises a programmable look up table.

* * * * *